United States Patent
Wu (10) Patent No.: US 7,116,183 B2
(45) Date of Patent: Oct. 3, 2006

(54) TEMPERATURE COMPENSATED VOLTAGE CONTROLLED OSCILLATOR

(75) Inventor: Yue Wu, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 3 days.

(21) Appl. No.: 10/773,771

(22) Filed: Feb. 5, 2004

(65) Prior Publication Data

US 2005/0174184 A1 Aug. 11, 2005

(51) Int. Cl.
*H03L 1/00* (2006.01)

(52) U.S. Cl. .................... 331/176; 331/66; 331/177 V; 331/117 R; 331/117 FE (58) Field of Classification Search ................ 331/176, 331/66, 177 V, 117 R, 117 FE
See application file for complete search history.

(56) References Cited

U.S. PATENT DOCUMENTS

| | | | |
|---|---|---|---|
| 3,050,693 A | 8/1962 | Sinninger | 331/10 |
| 3,119,079 A | 1/1964 | Keizer | 332/167 |
| 3,416,100 A | 12/1968 | Kruse, Jr. et al. | 331/108 R |
| 3,619,803 A | 11/1971 | Klein et al. | 331/8 |
| 3,857,110 A | 12/1974 | Grebene | 331/108 D |
| 3,867,706 A | 2/1975 | Gili | 331/1 R |
| 4,633,197 A | 12/1986 | Vanderspool, III | 332/124 |
| 4,763,086 A | 8/1988 | Haight et al. | 331/109 |
| 4,851,789 A | 7/1989 | Dobos | 331/108 R |
| 4,921,467 A | 5/1990 | Lax | 455/264 |
| 4,978,930 A * | 12/1990 | Suter | 331/176 |
| 5,179,725 A | 1/1993 | Camp, Jr. et al. | 455/164.2 |
| 5,418,503 A | 5/1995 | Glazebrook | 331/167 |
| 5,463,360 A | 10/1995 | Buoli et al. | 331/96 |
| 5,627,498 A | 5/1997 | Meyer | 331/117 R |
| 5,757,244 A | 5/1998 | Nonaka et al. | 331/176 |
| 5,789,986 A | 8/1998 | Drost et al. | 331/2 |
| 5,912,595 A | 6/1999 | Ma et al. | 331/117 D |
| 5,973,573 A | 10/1999 | Iravani et al. | 331/57 |
| 6,040,744 A | 3/2000 | Sakurai et al. | 331/176 |
| 6,308,055 B1 | 10/2001 | Welland et al. | 455/260 |
| 6,445,257 B1 | 9/2002 | Cox et al. | 331/117 R |
| 6,563,388 B1 | 5/2003 | Masenas et al. | 331/17 |

(Continued)

FOREIGN PATENT DOCUMENTS

EP 0248589 5/1987

(Continued)

OTHER PUBLICATIONS

DeVito, Lawrence (2003) Unusual clock recovery architecture ameliorates SONET jitter tradeoff. Presented at University of California Berkeley.

(Continued)

*Primary Examiner*—Arnold Kinkead
(74) *Attorney, Agent, or Firm*—Philip Wadsworth; Charles D. Brown; Kenyon S. Jenckes (57) ABSTRACT

A VCO with temperature compensation is achieved using reverse biased diodes. The VCO includes an amplifier that provides the required signal gain, a resonator tank circuit that provides the required phase shift, and at least one frequency tuning circuit for tuning the frequency of the oscillator signal. Each frequency tuning circuit includes at least one tuning capacitor and at least one MOS pass transistor that connects or disconnects the tuning capacitor (s) to/from the resonator tank circuit. Each reverse biased diode may be a parasitic diode that is formed at a drain or source junction of a MOS transistor. The reverse biased diodes have capacitance that can be controlled by a reverse bias voltage to compensate for drift in the VCO oscillation frequency over temperature.

19 Claims, 10 Drawing Sheets

U.S. PATENT DOCUMENTS 6,574,288 B1 * 6/2003 Welland et al. ............. 375/327

FOREIGN PATENT DOCUMENTS

| EP | 0658004 | 12/1994 |
|---|---|---|
| EP | 0735693 | 10/1996 |
| EP | 1189351 | 3/2002 |
| EP | 1328060 | 7/2003 |
| JP | 7123327 | 5/1995 |

OTHER PUBLICATIONS

McMahill, et al. (2002) Automatic calibration of modulated frequency synthesizers. IEEE Transactions on Circuits and Systems 49(5):301-311.

* cited by examiner

Junction Parasitic Capacitors
(for Parasitic Diodes)

FIG. 13

TEMPERATURE COMPENSATED VOLTAGE CONTROLLED OSCILLATOR

BACKGROUND

I. Field

The present invention relates generally to circuits, and more specifically to a voltage controlled oscillator (VCO) with temperature compensation.

II. Background

VCOs are an integral part of many electronics circuits and are particularly important in communication circuits. For example, VCOs are often used to generate local oscillator (LO) signals, which are used by transmitter and receiver subsystems for frequency upconversion and downconversion, respectively. VCOs are also used to generate clock signals for synchronous circuits (e.g., flip-flops). A wireless device (e.g., a cellular phone) in a wireless communication system may employ multiple VCOs to generate LO signals for transmitter and receiver circuitry and clock signals for digital circuitry.

A VCO typically employs one or more variable capacitors (varactors) to allow for adjustment of the frequency of oscillation for the VCO. The tuning range of the VCO refers to the range of oscillation frequencies achieved by varying the varactors. The tuning range is used to (1) ensure that the VCO can operate at the required frequency or range of frequencies and (2) compensate for changes in oscillation frequency due to component tolerances, integrated circuit (IC) process variations, and so on.

The circuit components of a VCO normally change with temperature. Consequently, the oscillation frequency of the VCO typically drifts with variation in temperature. For many applications (e.g., wireless communication), the temperature dependent frequency drift is a concern and is accounted for by designing the VCO with extra tuning range to cover this frequency drift. The extra tuning range may degrade the phase noise performance of the VCO. Phase noise refers to short-term random frequency fluctuations of an oscillator signal and is a parameter used to describe the quality of the oscillator signal. If the temperature dependent frequency drift can be reduced or minimized, then it may be possible to improve the overall performance of the VCO.

There is therefore a need in the art for a VCO with temperature compensation.

SUMMARY

A VCO with temperature compensation is achieved using reverse biased diodes. The oscillation frequency of a VCO typically drops as temperature increases. This phenomenon occurs mainly because capacitors and inductors that determine the oscillation frequency increase in value with temperature. A reverse biased diode, which is a diode having a reverse bias voltage applied, has a capacitance that varies with the amount of reverse bias voltage. This characteristic of the reverse biased diode can be used to achieve temperature compensation for the VCO.

An embodiment provides an integrated circuit comprising a VCO and at least one reverse biased diode. The VCO provides an oscillator signal having a frequency. In one exemplary design, the VCO includes an amplifier that provides the required signal gain, a resonator tank circuit that provides the required phase shift, and at least one frequency tuning circuit used to tune the frequency of the oscillator signal. Each frequency tuning circuit includes at least one tuning capacitor and at least one metal-oxide semiconductor (MOS) pass transistor that connects or disconnects the tuning capacitor(s) from the resonator tank circuit.

The at least one reverse biased diode has a capacitance that can be controlled by a reverse bias voltage to compensate for drift in the oscillation frequency over temperature. Each reverse biased diode may be a parasitic diode that is formed at a drain or source junction of a MOS transistor (e.g., a MOS pass transistor in the frequency tuning circuit). A bias voltage generator generates the proper reverse bias voltage for the at least one reverse biased diode.

BRIEF DESCRIPTION OF THE DRAWINGS

The features and nature of the present invention will become more apparent from the detailed description set forth below when taken in conjunction with the drawings in which like reference characters identify correspondingly throughout and wherein.

DETAILED DESCRIPTION

A VCO may be implemented with various designs known in the art. Some VCO designs are more suitable for radio frequency (RF), fabrication on an IC, or for providing better phase noise performance. A VCO may also be designed to operate at a specific frequency or a range of frequencies, depending on the requirements of the application for which the VCO will be used.

Figure 1A:
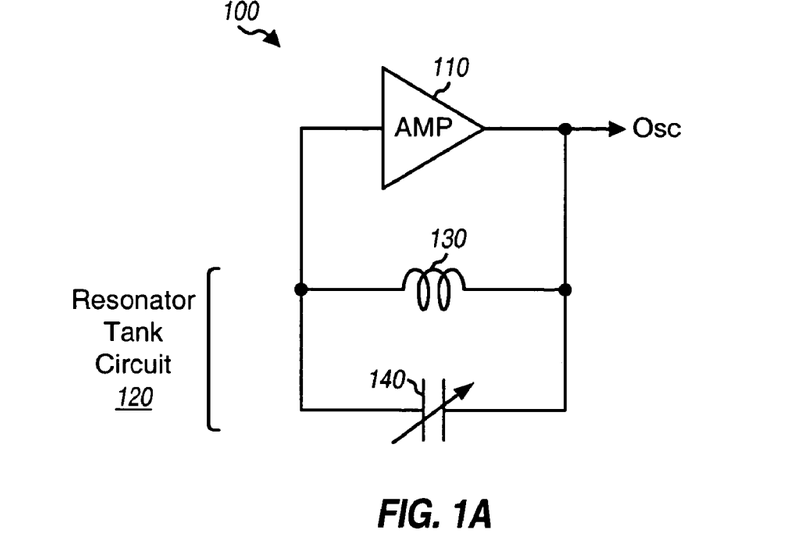
FIGS. 1A and 1B show two VCO designs.

FIG. 1A shows a schematic diagram of a VCO 100 for a first design. VCO 100 includes an amplifier 110 and a resonator tank circuit 120, which is composed of an inductor 130 and a variable capacitor (varactor) 140. Amplifier 110 provides the signal gain needed for oscillation. Amplifier 110 and resonator tank circuit 120 collectively provide the 360° phase shift needed for oscillation. VCO 100 provides an oscillator signal (Osc) having a fundamental frequency of $f_{osc}$. The oscillation frequency $f_{osc}$ is determined predominantly by the inductance (L) of inductor 130 and the capacitance (C) of varactor 140 and may be expressed as:

$$f_{osc} = \frac{1}{2\pi\sqrt{LC}}. \qquad \text{Eq (1)}$$

Figure 1B:
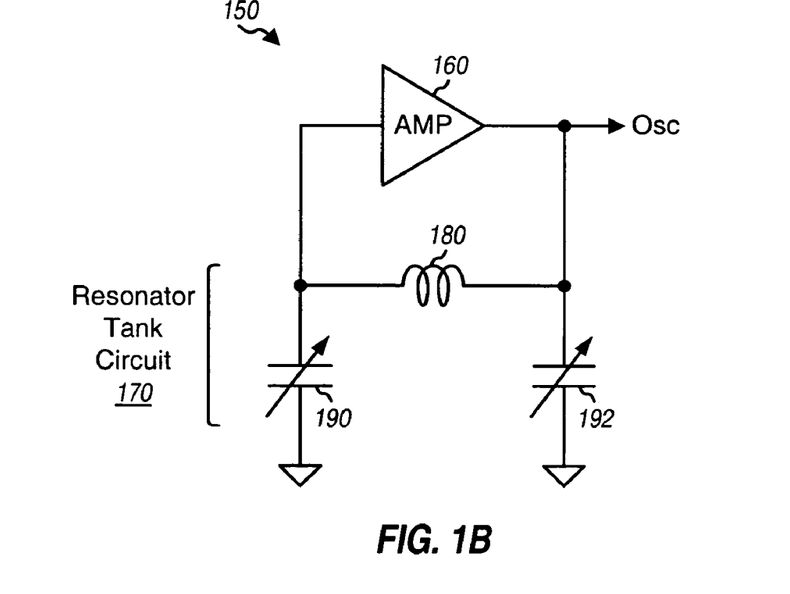

FIG. 1B shows a schematic diagram of a VCO 150 for a second design. VCO 150 includes an amplifier 160 and a resonator tank circuit 170, which is composed of an inductor 180 and varactors 190 and 192. Amplifier 160 provides the signal gain needed for oscillation. Amplifier 160 and resonator tank circuit 170 collectively provide the phase shift needed for oscillation. The oscillation frequency $f_{osc}$ is determined predominantly by the values of inductor 180 and varactors 190 and 192, as shown in equation (1).

FIGS. 1A and 1B show two exemplary VCO designs. Other designs may also be used for the VCO. For simplicity, FIGS. 1A and 1B show only the basic circuit components of VCOs 100 and 150. A VCO typically includes other support circuitry to provide biasing, frequency control, and so on. The support circuitry is not shown in FIGS. 1A and 1B.

VCOs 100 and 150 may be implemented in various manners and fabricated with various IC process technologies such as complementary metal-oxide semiconductor (CMOS), bipolar junction transistor (BJT), bipolar-CMOS (BiCMOS), silicon germanium (SiGe), gallium arsenide (GaAs), and so on.

Figure 2:
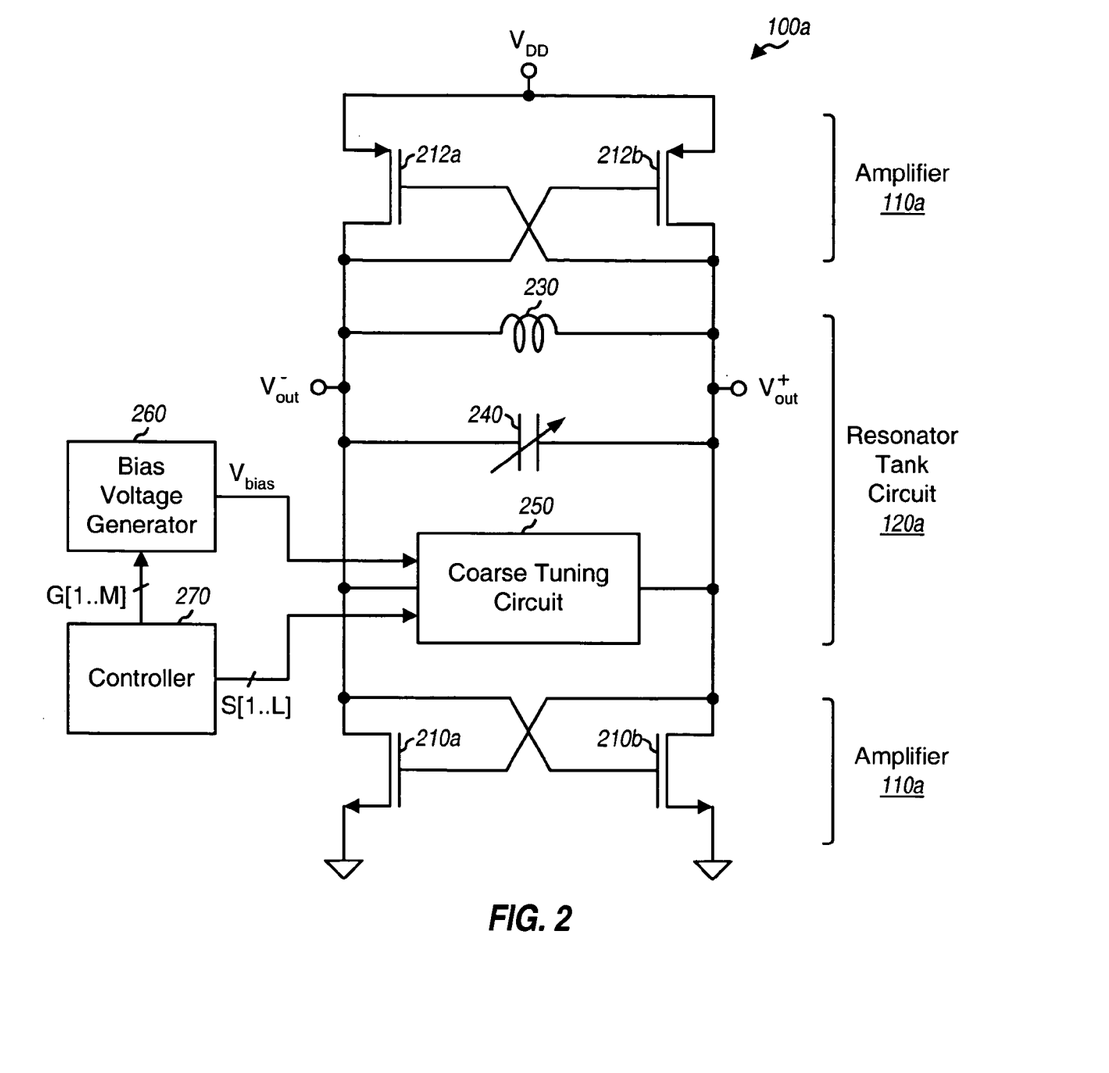
FIG. 2 shows a CMOS design for the VCO in FIG. 1A.

FIG. 2 shows a schematic diagram of a VCO 100a, which is an exemplary CMOS design for VCO 100 in FIG. 1A. VCO 100a includes an amplifier 110a and a resonator tank circuit 120a, which are an embodiment of amplifier 110 and resonator tank circuit 120, respectively, in FIG. 1A. VCO 100a may be fabricated on a CMOS IC.

Amplifier 110a is composed of N-channel MOS (N-MOS) transistors 210a and 210b and P-channel MOS (P-MOS) transistors 212a and 212b. Transistors 210a and 212a form a first inverter, and transistors 210b and 212b form a second inverter. Transistor 210a has its source coupled to circuit ground, its drain coupled to the drain of transistor 212a, and its gate coupled to a node $V_{out}^+$. Transistor 212a has its source coupled to a power supply, $V_{DD}$, its drain coupled to the drain of transistor 210a, and its gate coupled to node $V_{out}^+$. Transistors 210b and 212b are coupled in similar manner as transistors 210a and 212a. Nodes $V_{out}^+$ and $V_{out}^-$ represent the input and output, respectively, of the first inverter. Nodes $V_{out}^-$ and $V_{out}^+$ also represent the input and output, respectively, of the second inverter. The first and second inverters are thus coupled in series and in a closed-loop configuration. Nodes $V_{out}^+$ and $V_{out}^-$ further represent the differential output of VCO 100a.

Resonator tank circuit 120a is composed of an inductor 230, a varactor 240, and a coarse tuning circuit 250, all of which couple in parallel and between nodes $V_{out}^-$ and $V_{out}^+$. Inductor 230 and varactor 240 may be fabricated on-chip or implemented with external circuit components. Varactor 240 may be adjusted to obtain the desired oscillation frequency for VCO 100a. For example, varactor 240 may be used to (1) account for frequency drift due to variations in the power supply, temperature, and so on, and (2) track the input frequency of a received RF signal. Varactor 240 may be replaced with multiple varactors, which can be coupled in series or parallel, to provide a wider tuning range.

Coarse tuning circuit 250 may be used to select different operating frequencies or different operating frequency bands. For example, a wireless device may be capable of communicating with multiple wireless communication systems. Each system may be associated with a different operating frequency. Coarse tuning circuit 250 may then be used to tune the oscillation frequency of the VCO to the frequency of the system with which the wireless device is in communication. As another example, the wireless device may communicate with a single wireless communication system that can transmit on multiple frequency bands. Coarse tuning circuit 250 may then be controlled such that the VCO operates at the desired frequency band.

A bias voltage generator 260 generates a $V_{bias}$ bias voltage for coarse tuning circuit 250. A controller 270 provides an L-bit control signal S[1 . . . L] for coarse tuning circuit 250 and an M-bit control signal G[1 . . . M] for bias voltage generator 260. In general, $L \geq 1$ and $M \geq 1$. Some exemplary designs for bias voltage generator 260 are described below.

Figure 3:
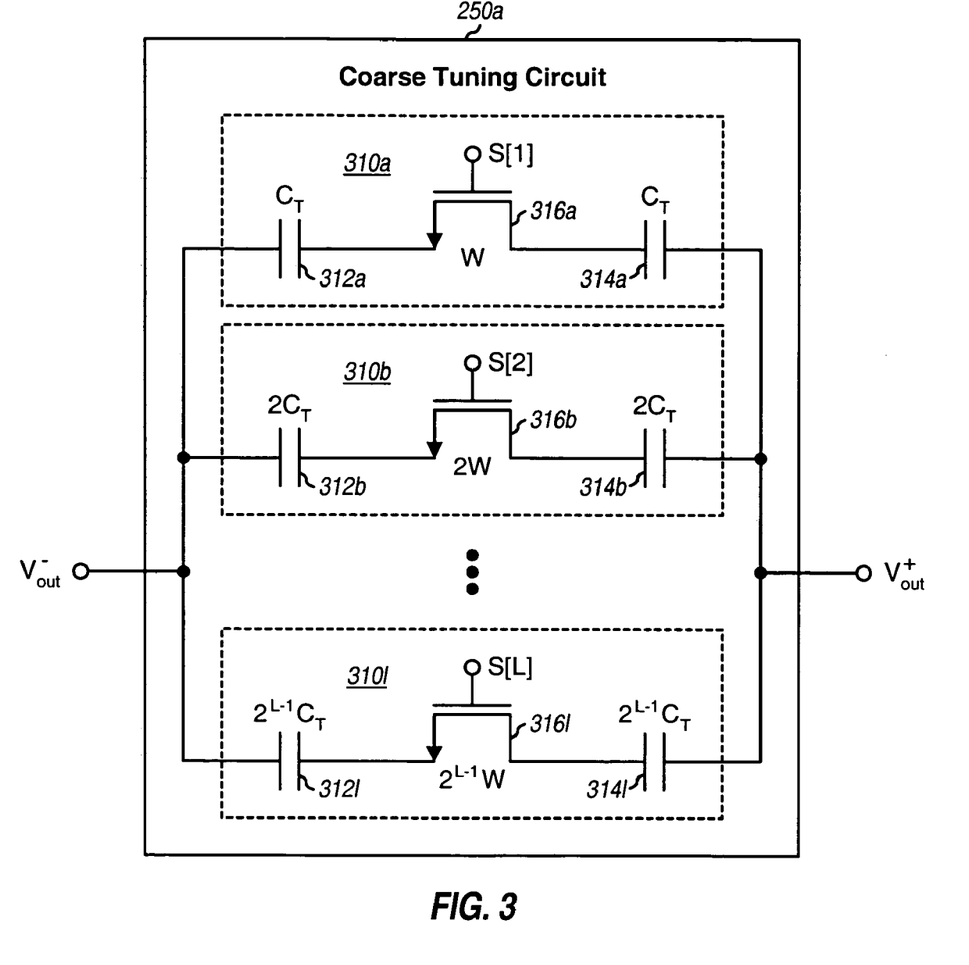
FIGS. 3 and 5 show two coarse tuning circuits for the VCO.

FIG. 3 shows a schematic diagram of a coarse tuning circuit 250a, which is one embodiment of coarse tuning circuit 250 in FIG. 2. Coarse tuning circuit 250a includes L frequency tuning circuits 310a through 310l for L tuning branches. Each frequency tuning circuit 310 is controlled by a respective S[x] control signal from controller 270, where x=1 . . . L.

Each frequency tuning circuit 310 includes tuning capacitors 312 and 314 and an N-MOS pass transistor 316, all of which are coupled in series and between nodes $V_{out}^-$ and $V_{out}^+$. Pass transistor 316 receives the S[x] control signal which enables or disables the transistor. Pass transistor 316 operates as a switch to either connect or disconnect tuning capacitors 312 and 314 to/from nodes $V_{out}^-$ and $V_{out}^+$. When pass transistor 316 is enabled by the S[x] control signal, the signal path through tuning capacitors 312 and 314 is closed. These capacitors are then connected between nodes $V_{out}^-$ and $V_{out}^+$ and directly affect the oscillation frequency of VCO 100a.

For the embodiment shown in FIG. 3, the L frequency tuning circuits 310a through 310l are implemented with binary decoding (i.e., binary weighting). For binary decoding, capacitors 312a and 314a for frequency tuning circuit 310a have capacitance of $C_T$, capacitors 312b and 314b for frequency tuning circuit 310b have capacitance of $2C_T$, and so on, and capacitors 312l and 314l for frequency tuning circuit 310l have capacitance of $2^{L-1} \cdot C_T$. Frequency tuning circuit 310a for the least significant bit (LSB) has the smallest tuning capacitance, and frequency tuning circuit 310l for the most significant bit (MSB) has the largest tuning capacitance.

Thermal decoding may also be used for coarse tuning circuit 250a. In this case, the tuning capacitors in each of the L frequency tuning circuits 310a through 310l have the same capacitance of $C_T$.

The quality factor (Q) for each tuning branch may be expressed as:

$$Q = \frac{1}{2\pi f C_b R_b}, \qquad \text{Eq (2)}$$

where $C_b$ is the total tuning capacitance for the branch, and $R_b$ is the series resistance for the branch.

To achieve the same quality factor for each of the L branches, pass transistor 316 for each branch has a dimension that is determined by the tuning capacitance for the branch. For binary decoding, the tuning capacitance for the second branch (circuit 310b) is double that of the first branch (circuit 310a). To achieve the same Q for the second branch, the series resistance for this branch is reduced by a factor of two relative to that of the first branch. This reduction in resistance can be achieved by doubling the width of pass transistor 316b (to 2W) relative to the width (W) of transistor 316a. The transistor sizes for the other branches are dimensioned in similar manner to achieve the same Q, as shown in FIG. 3.

For simplicity, FIG. 3 shows only the basic circuit components for coarse tuning circuit 250a. Other circuitry for controlling the pass transistors and for biasing the tuning capacitors is not shown in FIG. 3 for simplicity.

Figure 4A:
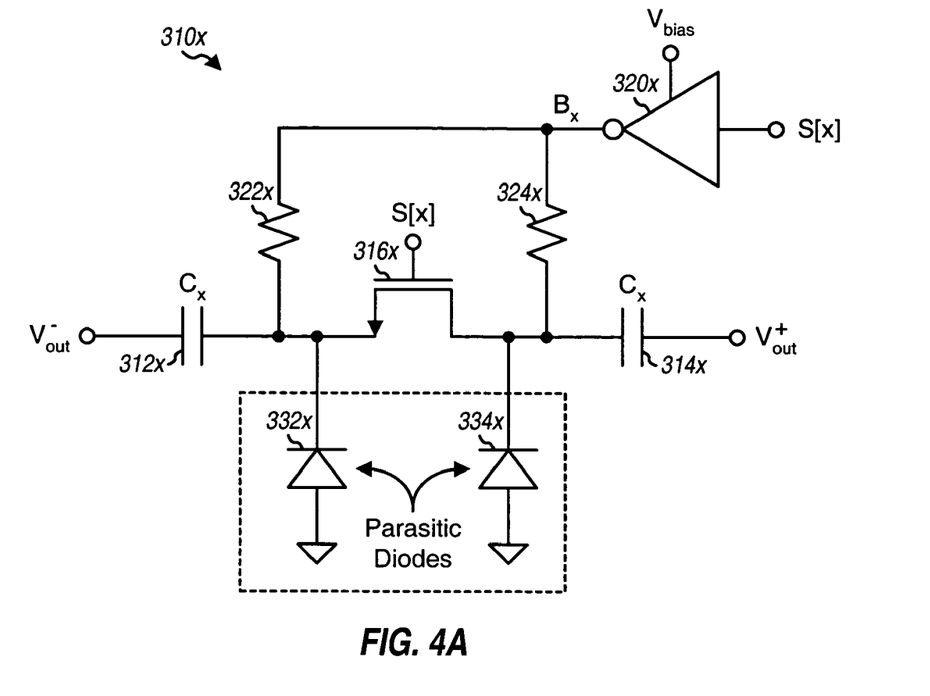
FIGS. 4A and 4B show a frequency tuning circuit and its equivalent circuit.

FIG. 4A shows a schematic diagram of a frequency tuning circuit $310x$, which is one of the L frequency tuning circuits 310 in FIG. 3. Circuit $310x$ includes tuning capacitors $312x$ and $314x$ and pass transistor $316x$, which are coupled in series and between nodes $V_{out}^-$ and $V_{out}^+$ as described above. Circuit $310x$ further includes an inverter $320x$ and resistors $322x$ and $324x$, which are used to provide biasing for tuning capacitors $312x$ and $314x$ and pass transistor $316x$. Resistors $322x$ and $324x$ have one end coupled to the output of inverter $320x$ and the other end coupled to the source and drain, respectively, of pass transistor $316x$. Inverter $320x$ receives the S[x] control signal for circuit $310x$ at its signal input and the $V_{bias}$ bias voltage at its supply input and provides a $B_x$ bias signal to resistors $322x$ and $324x$.

Frequency tuning circuit $310x$ operates as follows. When the S[x] control signal is at logic high, the $B_x$ bias signal has a voltage of zero, pass transistor $316x$ is turned on, and tuning capacitors $312x$ and $314x$ are connected to nodes $V_{out}^-$ and $V_{out}^+$. Conversely, when the S[x] control signal is at logic low, the $B_x$ bias signal is at the $V_{bias}$ bias voltage, pass transistor $316x$ is turned off, and tuning capacitors $312x$ and $314x$ are floating and not connected to nodes $V_{out}^-$ and $V_{out}^+$. The source and drain junctions of pass transistor $316x$ are reverse biased by $V_{bias}$ volts when the transistor is turned off. This reverse bias voltage ensures that pass transistor $316x$ is fully turned off and further reduces the parasitic capacitance of the transistor.

In most VCOs, such as VCO $100a$, the oscillation frequency drops as temperature increases. The main reason for this phenomenon is because the values of the capacitors and inductors that predominantly determine the oscillation frequency increase with temperature. The increase in capacitance with temperature is due to increased electron mobility and potential voltage change at higher temperature. Since oscillation frequency is inversely related to capacitance and inductance, as shown in equation (1), increasing the capacitance and/or inductance will cause the oscillation frequency to drop.

For a VCO that is fabricated on an integrated circuit, parasitic diodes are formed at the source and drain junctions of a MOS transistor that is reverse biased. For example, in FIG. 4A, when the $B_x$ bias signal is at the $V_{bias}$ voltage and the S[x] control signal is at logic low, the source and drain junctions of N-MOS pass transistor $316x$ are reverse biased, and parasitic diodes $332x$ and $334x$ are formed at the reverse biased source and drain junctions, respectively. Parasitic diodes $332x$ and $334x$ have capacitance that also increases with temperature. The capacitance of parasitic diodes $332x$ and $334x$ may be a major source (and in some cases, a dominant source) of the total capacitance variation over temperature.

Figure 4B:
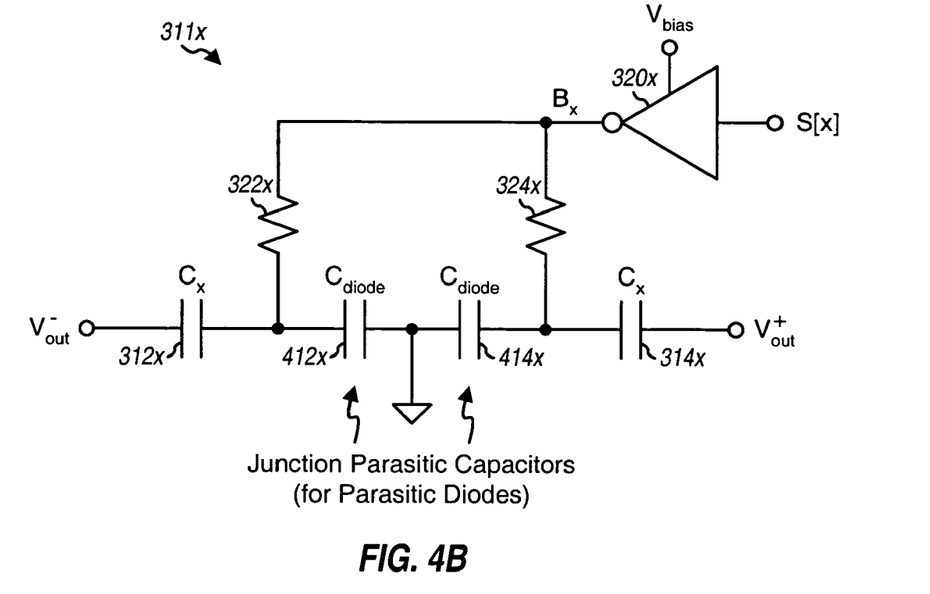

FIG. 4B shows a schematic diagram of an equivalent circuit $311x$ for frequency tuning circuit $310x$ when pass transistor $316x$ is turned off. For equivalent circuit $311x$, pass transistor $316x$ is removed but parasitic diodes $332x$ and $334x$ are present and modeled with parasitic capacitors $412x$ and $414x$, respectively, having capacitance of $C_{diode}$. Capacitors $312x$ and $412x$ are coupled in series and between node $V_{out}^-$ and circuit ground. Similarly, capacitors $314x$ and $414x$ are coupled in series and between node $V_{out}^+$ and circuit ground. Since the junction parasitic capacitance is typically much smaller than the tuning capacitance (i.e., $C_{diode} << C_x$), the total capacitance of the series-coupled capacitors $312x$ and $412x$ is mainly determined by the junction parasitic capacitance.

The junction parasitic capacitance $C_{diode}$ is determined by the size of parasitic diodes $332x$ and $334x$, which are in turn determined by the size of pass transistor $316x$. Parasitic diodes $332x$ and $334x$ can be relatively large if the drain and source area of pass transistor $316x$ is large, which may be the case in order to achieve a high quality factor for the tuning branch. Thus, the junction parasitic capacitance may have a non-negligible impact on the oscillation frequency but can be compensated for, as described below.

Figure 5:
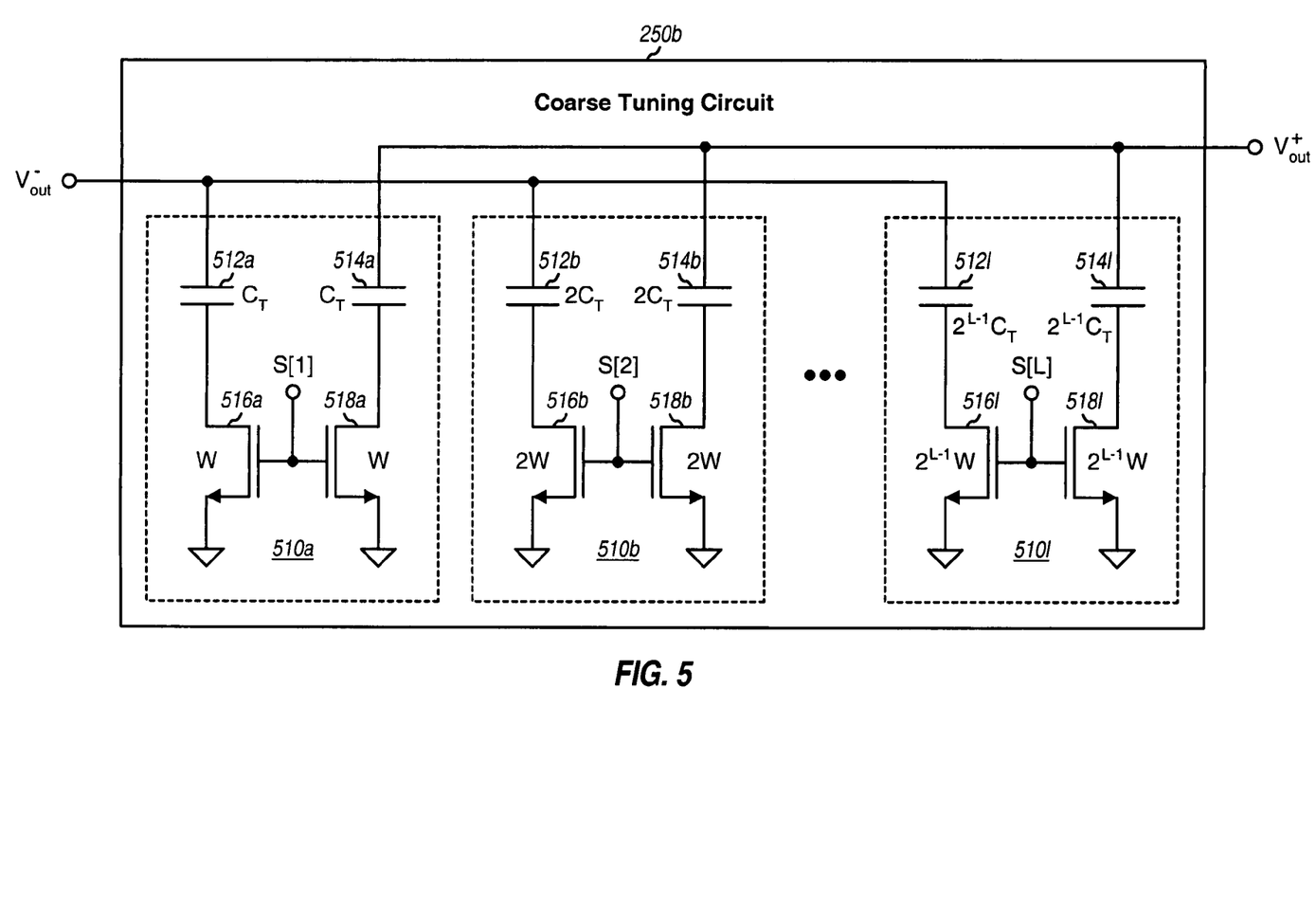

FIG. 5 shows a schematic diagram of a coarse tuning circuit $250b$, which is another embodiment of coarse tuning circuit 250 in FIG. 2. Coarse tuning circuit $250b$ includes L frequency tuning circuits $510a$ through $510l$, each of which is controlled by a respective S[x] control signal from controller 270. Coarse tuning circuit $250b$ provides "shunt" tuning capacitance to circuit ground whereas coarse tuning circuit $250a$ provides "parallel" tuning capacitance between nodes $V_{out}^-$ and $V_{out}^+$. Coarse tuning circuit $250b$ may also be used for the VCO design shown in FIG. 1B.

Each frequency tuning circuit 510 includes tuning capacitors 512 and 514 and N-MOS pass transistors 516 and 518. Pass transistors 516 and 518 have their sources coupled to circuit ground, their gates coupled together, and their drains coupled to one end of tuning capacitors 512 and 514, respectively. The other end of tuning capacitors 512 and 514 couple to nodes $V_{out}^-$ and $V_{out}^+$, respectively. Pass transistors 516 and 518 receive the S[x] control and operate as switches to either connect or disconnect tuning capacitors 512 and 514 to/from nodes $V_{out}^-$ and $V_{out}^+$.

For the embodiment shown in FIG. 5, the L frequency tuning circuits $510a$ through $510l$ are implemented with binary decoding, as described above for FIG. 3.

Figure 6A:
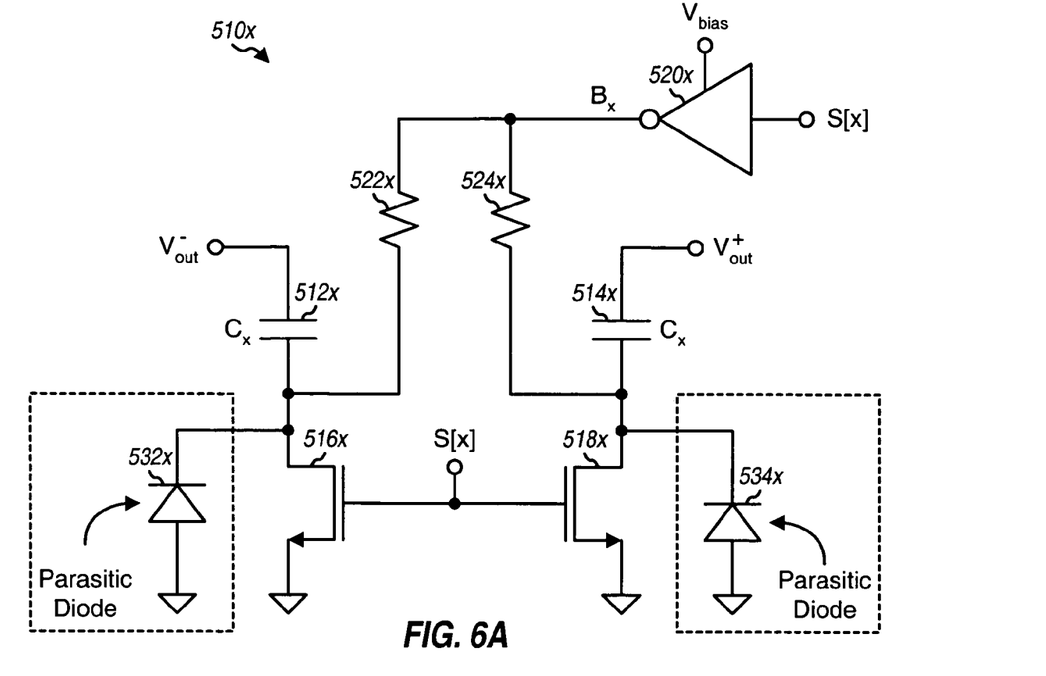
FIGS. 6A and 6B show another frequency tuning circuit and its equivalent circuit.

FIG. 6A shows a schematic diagram of a frequency tuning circuit $510x$, which is one of the L frequency tuning circuits 510 in FIG. 5. Circuit $510x$ includes tuning capacitors $512x$ and $514x$ and pass transistors $516x$ and $518x$, which are coupled as described above. Circuit $510x$ further includes an inverter $520x$ and resistors $522x$ and $524x$, which are used to provide biasing for tuning capacitors $512x$ and $514x$ and pass transistors $516x$ and $518x$, as also described above. Parasitic diodes $532x$ and $534x$ are formed at the drains of pass transistors $516x$ and $518x$ when these transistors are turned off and a reverse biased voltage is applied at the drain junction.

Figure 6B:
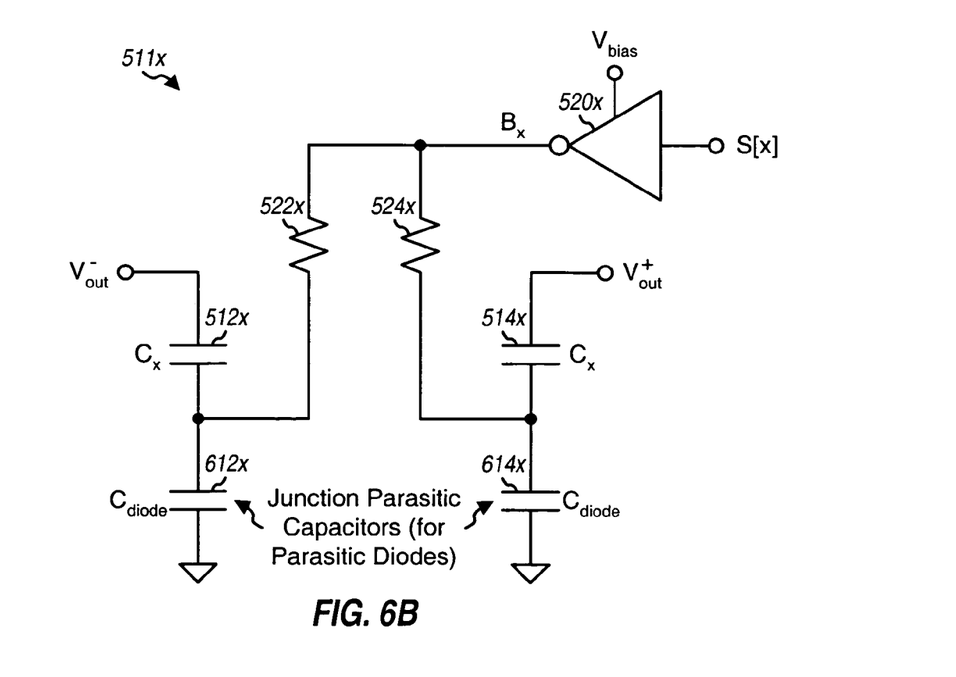

FIG. 6B shows a schematic diagram of an equivalent circuit $511x$ for frequency tuning circuit $510x$ when pass transistors $516x$ and $518x$ are turned off. For equivalent circuit $511x$, pass transistors $516x$ and $518x$ are removed but parasitic diodes $532x$ and $534x$ are present and modeled with parasitic capacitors $612x$ and $614x$, respectively, having capacitance of $C_{diode}$. Capacitors $512x$ and $612x$ are coupled in series and between node $V_{out}^-$ and circuit ground. Similarly, capacitors $514x$ and $614x$ are coupled in series and between node $V_{out}^+$ and circuit ground. Equivalent circuit $511x$ resembles equivalent circuit $311x$ in FIG. 4B.

The capacitance of reverse biased diodes, such as parasitic diodes $332x$ and $334x$ in FIG. 4A and parasitic diodes $532x$ and $534x$ in FIG. 6A, increases with temperature. This causes the oscillation frequency to drop with increasing temperature. The amount of frequency drop can be relatively large. For example, in one exemplary VCO design, the capacitance of parasitic diodes $332x$ and $334x$ was observed to increase by 0.8 percent (or approximately 11 femto-Farads) over a specified range of temperature, which causes the oscillation frequency to drop by 8 MHz from a nominal frequency of 2 GHz. This amount of frequency drift may be considered to be large for certain applications, such as wireless communication, where frequency stability is important to achieve good system performance.

Temperature compensation for VCOs, such as VCO 100a, may be achieved using reverse biased diodes. In general, the reverse biased diodes may be fabricated on an integrated circuit specifically for temperature compensation or may be parasitic diodes such as those formed at the junctions of MOS transistors. The capacitance of a reverse biased diode decreases when the reverse bias voltage increases. By applying an appropriate reverse bias voltage, the diode capacitance can be decreased by a proper amount to compensate for any increase in the capacitance of the diode and possibly other circuit components of the VCO due to temperature. Temperature compensation using reverse biased diodes is described in detail below.

Figure 7:
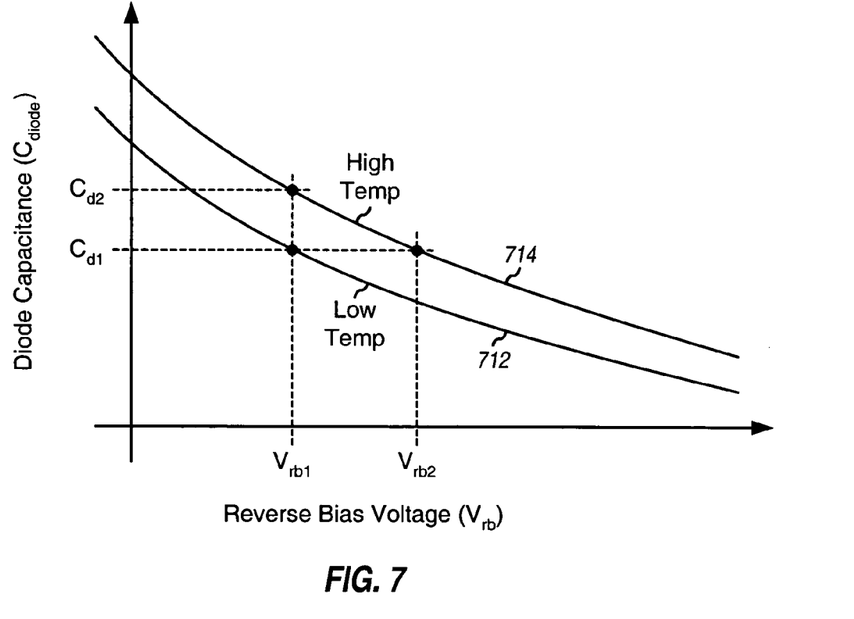
FIG. 7 shows plots of capacitance versus reverse bias voltage for a diode.

FIG. 7 shows plots of capacitance versus reverse bias voltage for a reverse biased diode. The vertical axis represents the capacitance ($C_{diode}$) of the reverse biased diode, and the horizontal axis represents the reverse bias voltage ($V_{rb}$) for the diode. For a given temperature, a plot of capacitance versus reverse bias voltage can be obtained for the reverse biased diode based on computer simulation, empirical measurement, and so on. In FIG. 7, plot 712 shows capacitance versus reverse bias voltage for a low temperature (e.g., 25° Celsius), and plot 714 shows capacitance versus reverse bias voltage for a high temperature (e.g., 90° Celsius). These plots indicate that the capacitance of the reverse biased diode decreases when a larger reverse bias voltage is applied to the diode. These plots also indicate that the shape of the plots for different temperatures is approximately the same. However, plot 714 for high temperature is shifted up relative to plot 712 for low temperature.

The reverse biased diode has a capacitance of $C_{d1}$ at low temperature when applied with a reverse bias voltage of $V_{rb1}$. The capacitance of the reverse biased diode increases to $C_{d2}$ at high temperature if the same reverse bias voltage $V_{rb1}$ is applied to the diode. This increase in capacitance from $C_{d1}$ to $C_{d2}$ causes a drop in oscillation frequency, as described above. The capacitance of $C_{d1}$ can be obtained at high temperature by applying a reverse bias voltage of $V_{rb2}$ to the diode. Thus, by increasing the reverse bias voltage from $V_{rb1}$ to $V_{rb2}$, the capacitance of the reverse biased diode is maintained approximately constant over the low to high temperature range. In one exemplary design, the diode capacitance can be decreased by 9 femto-Farads by increasing the reverse bias voltage from 2.0 to 2.4 volts.

Reverse biased diodes may also be used to compensate for changes in other circuit components of the VCOs. For example, referring back to FIGS. 4A and 4B, parasitic diode 332x may be used to compensate for changes in the capacitance of diode 332x as well as the capacitance of tuning capacitor 312x, so that the total capacitance of the branch is approximately constant over temperature. The parasitic diodes for all of the disabled branches in coarse tuning circuit 250a may also be used to compensate for changes in inductor 230, varactor 240, and other circuit components of VCO 100a such as transistors 210a, 210b, 212a and 212b. Inductors and capacitors fabricated on an integrated circuit are typically not as sensitive to temperature and may change little (percentage wise) over temperature. Diodes fabricated on an integrated circuit are more sensitive to temperature (than inductors and capacitors) and their capacitance generally change more (percentage wise) with temperature. Thus, temperature-dependent changes for inductors and capacitors may be compensated with reverse biased diodes.

For VCO 100a, coarse tuning circuit 250 may be the dominant source of frequency change with temperature. However, the number and the size of the reverse biased diodes available for temperature compensation are related to the number and the size of the diodes causing temperature-dependent frequency change. For example, frequency tuning circuit 310l for the most significant bit of tuning control S[L] has the largest parasitic diodes (resulting from the largest-sized pass transistors) and thus causes the most temperature-dependent frequency change. However, the largest reverse junction capacitance is also available for frequency tuning circuit 310l to perform temperature compensation. As another example, when more branches are disabled, more parasitic diodes are available to both cause temperature-dependent frequency change and perform temperature compensation.

A proper $V_{bias}$ bias voltage can be applied to the parasitic diodes of the pass transistors to achieve temperature compensation for VCO 100a. The proper bias voltage is dependent on (1) the amount of change in capacitance desired for the parasitic diodes and (2) a function for reverse junction capacitance versus reverse bias voltage. The desired capacitance change may be dependent on various factors such as the VCO design, the circuit components of the VCO, and so on. The function for capacitance versus reverse bias voltage may also be dependent on various factors such as the design of the MOS transistors, IC process, and so on. In any case, an overall function for reverse bias voltage versus temperature that achieves temperature compensation for the VCO can be determined by computer simulation, empirical measurement, and so on.

Referring back to FIG. 4A, the $B_x$ bias signal from inverter 320x provides the reverse bias voltage for parasitic diodes 332x and 334x when pass transistor 316x is turned off. The voltage of the $B_x$ bias signal is determined by the $V_{bias}$ bias voltage provided to the supply input of inverter 320x. The $V_{bias}$ bias voltage may be generated in various manners, some of which are described below.

Figure 8:
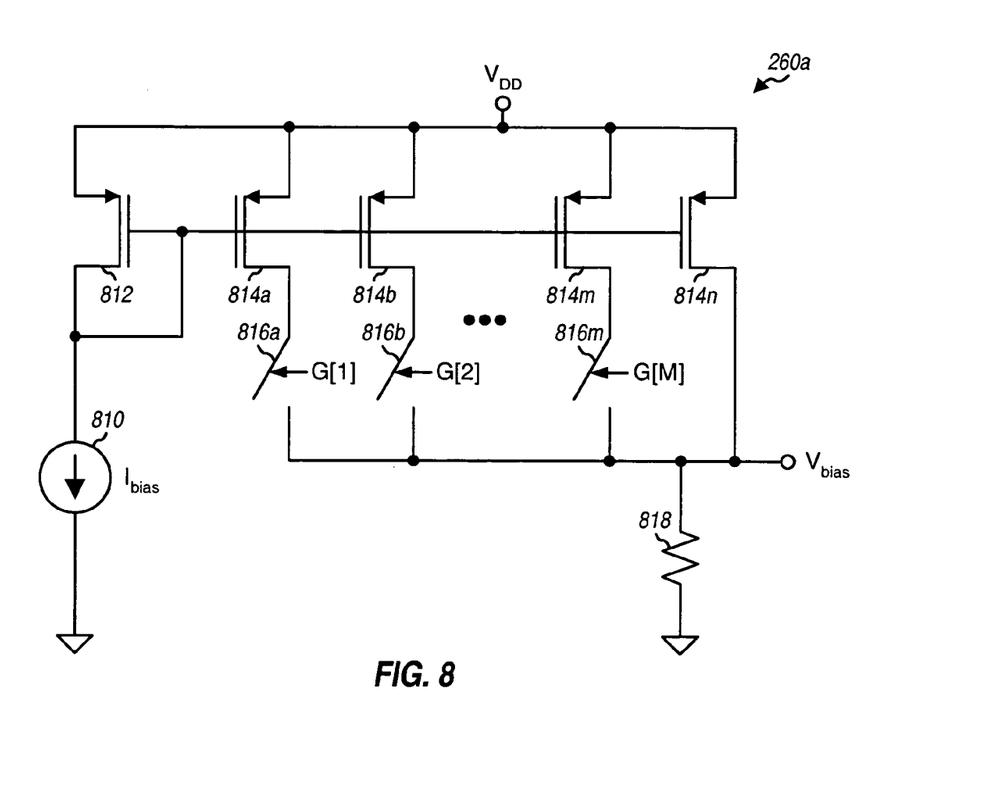
FIGS. 8 and 10 show two bias voltage generators.

FIG. 8 shows a schematic diagram of a bias voltage generator 260a, which is one embodiment of bias voltage generator 260 in FIG. 2. Generator 260a can generate the $V_{bias}$ bias voltage for the parasitic diodes of the pass transistors.

Bias voltage generator 260a includes a current source 810, a P-MOS transistor 812, M+1 P-MOS transistors 814a through 814n, M switches 816a through 816m for transistors 814a through 814m, respectively, and a load resistor 818. In general, M may be any integer one or greater. Transistor 812 has its source coupled to the power supply, $V_{DD}$, and its gate coupled to its drain. Current source 810 has one end coupled to the drain of transistor 812 and the other end coupled to circuit ground. Transistor 814n has its source coupled to the power supply, its gate coupled to the gate of transistor 812, and its drain coupled to a node for the $V_{bias}$ bias voltage. Each of transistors 814a through 814m has its source coupled to the power supply, its gate coupled to the gate of transistor 812, and its drain coupled to one end of a respective switch 816. The other end of switches 816a through 816m couples to the $V_{bias}$ node. Load resistor 818 couples between the $V_{bias}$ node and circuit ground.

Bias voltage generator 260a operates as follows. Current source 810 provides an $I_{bias}$ bias current. Transistor 812 and transistors 814a through 814n form a current mirror. Each of transistors 814a through 814n provides a version of the $I_{bias}$ bias current. In particular, the current through each of transistors 814a through 814n is dependent on the $I_{bias}$ bias current and the ratio of the size of transistor 814 to the size of transistor 812. Transistors 814a through 814m may be implemented with binary decoding (i.e., with increasing transistor sizes) or thermal decoding (i.e., with the same transistor size). Transistor 814n is always on and provides its current to load resistor 818. Switches 816a through 816m receive control signals G[1] through G[M], respectively, which open or close these switches. When a given switch 816 is closed, the current through the associated transistor 814 is provided to load resistor 818. The voltage on the $V_{bias}$ node is dependent on (1) the total current provided by all of the enabled transistors 814 to load resistor 818 and (2) the resistance of resistor 818. When more switches 816 are enabled, more current is provided to load resistor 818 and a higher voltage is obtained for the $V_{bias}$ bias voltage.

A temperature dependent $V_{bias}$ bias voltage may be obtained with either a temperature-dependent current or a temperature-dependent resistor. For example, load resistor 818 may be a fixed value and the $I_{bias}$ bias current may be proportional to absolute temperature (PTAT), which means that the current increases linearly with absolute temperature given in degrees Kelvin. Alternatively, the $I_{bias}$ bias current may be a fixed value and load resistor 818 may have a resistance that is proportional to absolute temperature.

Figure 9:
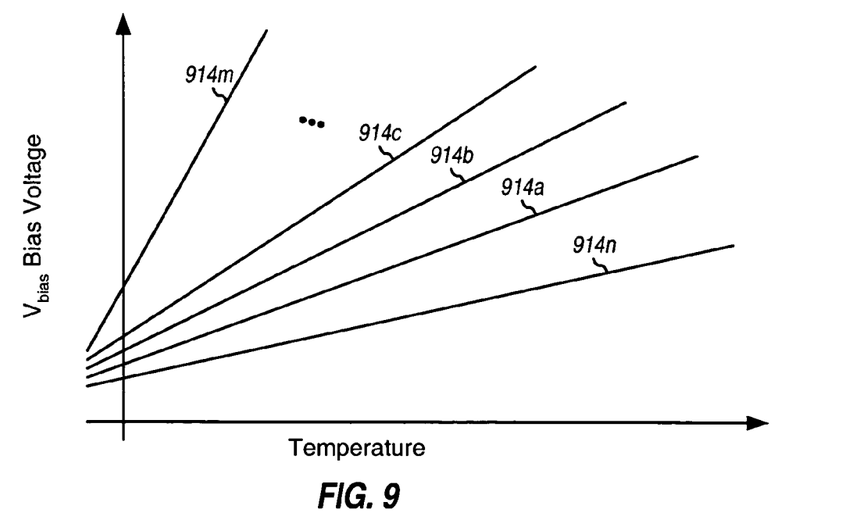
FIG. 9 shows plots of bias voltage versus temperature for the bias voltage generator in FIG. 8.

FIG. 9 shows plots of the $V_{bias}$ bias voltage versus temperature for bias voltage generator 260a in FIG. 8. When all of switches 816a through 816m are turned off, only transistor 814n provides current to load resistor 818, and plot 914n shows the $V_{bias}$ bias voltage versus temperature for this case. The $V_{bias}$ bias voltage increases linearly with increasing temperature because the $I_{bias}$ bias current increases linearly with increasing temperature. When switch 816a is turned on, transistors 814a and 814n provide current to load resistor 818, and plot 914a shows the $V_{bias}$ bias voltage versus temperature for this case. Plot 914a has a higher slope than plot 914n because more current is provided to load resistor 818 by the additional transistor 814a. Plots 914b through 914m have progressively higher slopes as more switches 816 are turned on and more transistors 814 provide their current to load resistor 818. The desired overall function to achieve temperature compensation for VCO 100a can be obtained by turning on an appropriate combination of switches 816.

Figure 10:
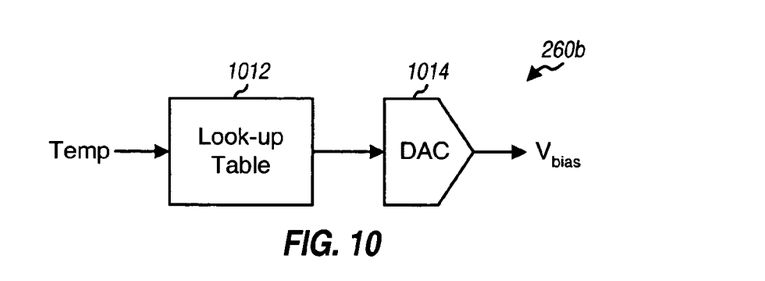

FIG. 10 shows a diagram of a bias voltage generator 260b, which is another embodiment of bias voltage generator 260 in FIG. 2. Bias voltage generator 260b includes a look-up table (LUT) 1012 and a digital-to-analog converter (DAC) 1014. Look-up table 1012 stores the overall function for reverse bias voltage versus temperature. Look-up table 1012 receives an indication of temperature (which, e.g., may be provided by a PTAT circuit) and provides a corresponding control word. DAC 1014 receives and converts the control word to a voltage, which is provided as the $V_{bias}$ bias voltage. Bias voltage generator 260b can provide greater flexibility in generating the $V_{bias}$ bias voltage. Look-up table 1012 can implement any linear or non-linear function and can be easily modified with a new function.

Two exemplary designs for generating the $V_{bias}$ bias voltage for reverse biased/parasitic diodes to achieve temperature compensation for a VCO are described above. The $V_{bias}$ bias voltage may also be generated in other manners, and this is within the scope of the invention.

Figure 11:
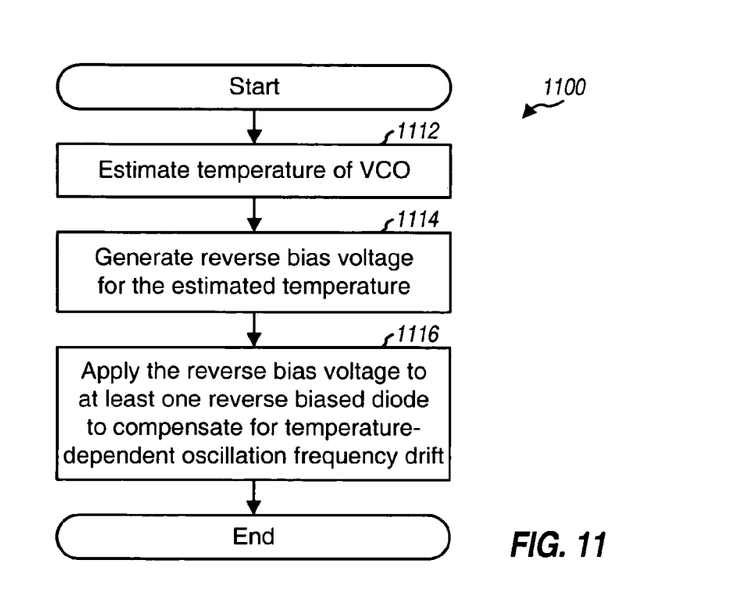
FIG. 11 shows a process for performing temperature compensation for a VCO using reverse biased diodes.

FIG. 11 shows a process 1100 for performing temperature compensation for a VCO using reverse biased diodes. The temperature of the VCO is estimated, for example, based on a circuit component having a characteristic that is proportional to absolute temperature (block 1112). A reverse bias voltage is then generated for the estimated temperature based on a function of reverse bias voltage versus temperature (block 1114). The reverse bias voltage is applied to at least one reverse biased diode to compensate for drift in oscillation frequency over temperature (block 1116). The reverse bias voltage adjusts the capacitance of the reverse biased diode(s) to compensate for changes in the capacitance of the VCO due to temperature.

VCOs with temperature compensation achieved using reverse biased diodes may be employed in various systems and applications such as communication, networking, computing, consumer electronics, and so on. For example, these temperature compensated VCOs may be used in wireless communication systems such as a Code Division Multiple Access (CDMA) system, a Time Division Multiple Access (TDMA) system, a Global System for Mobile Communications (GSM) system, an Advanced Mobile Phone System (AMPS) system, Global Positioning System (GPS), a multiple-input multiple-output (MIMO) system, an orthogonal frequency division multiplexing (OFDM) system, an orthogonal frequency division multiple access (OFDMA) system, a wireless local area network (WLAN), and so on. The use of the temperature compensated VCOs for wireless communication is described below.

Figure 12:
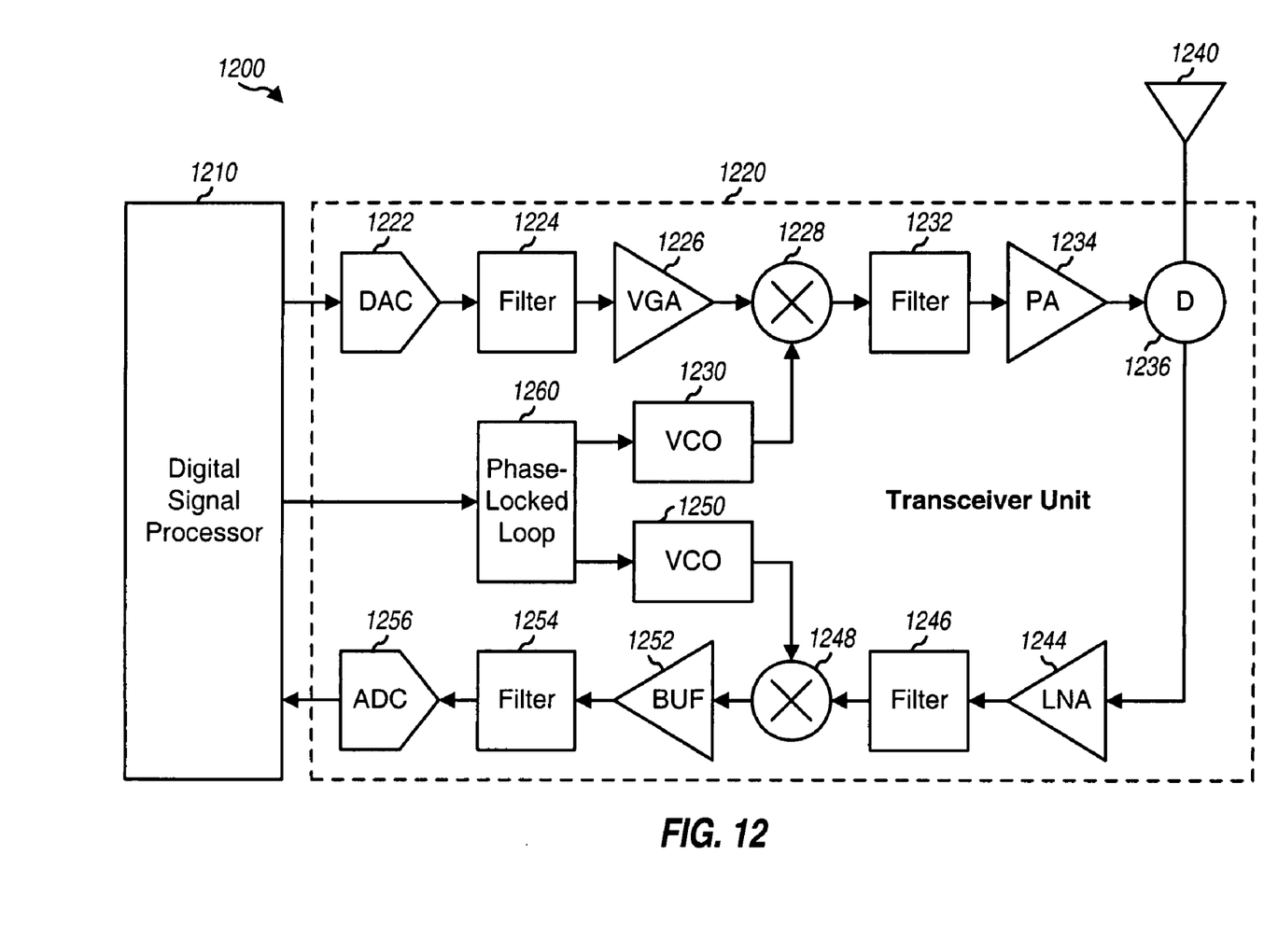
FIG. 12 shows a wireless device.

FIG. 12 shows a block diagram of a wireless device 1200 that may be used for wireless communication. Wireless device 1200 may be a cellular phone, a terminal, a handset, or some other device or design. Wireless device 1200 is capable of providing bi-directional communication via a transmit path and a receive path.

On the transmit path, a digital signal processor (DSP) 1210 processes data to be transmitted and provides a stream of chips to a transceiver unit 1220. Within transceiver unit 1220, one or more digital-to-analog converters (DACs) 1222 convert the stream of chips to one or more analog signals. The analog signal(s) are filtered by a filter 1224, amplified by a variable gain amplifier (VGA) 1226, and frequency upconverted from baseband to RF by a mixer 1228 to generate an RF signal. The frequency upconversion is performed with an upconversion LO signal from a VCO 1230. The RF signal is filtered by a filter 1232, amplified by a power amplifier (PA) 1234, routed through a duplexer (D) 1236, and transmitted from an antenna 1240.

On the receive path, a modulated signal is received by antenna 1240, routed through duplexer 1236, amplified by a low noise amplifier (LNA) 1244, filtered by a filter 1246, and frequency downconverted from RF to baseband by a mixer 1248 with a downconversion LO signal from a VCO 1250. The downconverted signal is buffered by a buffer 1252, filtered by a filter 1254, and digitized by one or more analog-to-digital converters (ADCs) 1256 to obtain one or more streams of samples. The sample stream(s) are provided to digital signal processor 1210 for processing.

FIG. 12 shows a specific transceiver design. In a typical transceiver, the signal conditioning for each path may be performed by one or more stages of amplifier, filter, mixer, and so on, as is known in the art. FIG. 12 only shows some of the circuit blocks that may be used for signal conditioning.

For the embodiment shown in FIG. 12, transceiver unit 1220 includes two VCOs 1230 and 1250 for the transmit and receive paths, respectively. VCOs 1230 and 1250 may be implemented with various VCO designs, such as the design shown in FIG. 2. Each VCO may also be designed to operate at a specific frequency or a range of frequencies. For example, VCOs 1230 and 1250 may be designed to operate at an integer multiple of (e.g., two times) one or more of the following frequency bands:

Personal Communication System (PCS) band from 1850 to 1990 MHz,

Cellular band from 824 to 894 MHz,

Digital Cellular System (DCS) band from 1710 to 1880 MHz,

GSM900 band from 890 to 960 MHz,

International Mobile Telecommunications-2000 (IMT-2000) band from 1920 to 2170 MHz, and Global Positioning System (GPS) band from 1574.4 to 1576.4 MHz.

VCOs 1230 and 1250 may be designed to operate at multiple frequency bands by providing sufficient tuning capacitors in the coarse tuning circuit. A phase locked loop (PLL) 1260 receives control information from digital signal processor 1210 and provides controls for VCOs 1230 and 1250 to generate the proper upconversion and downconversion LO signals, respectively.

Figure 13:
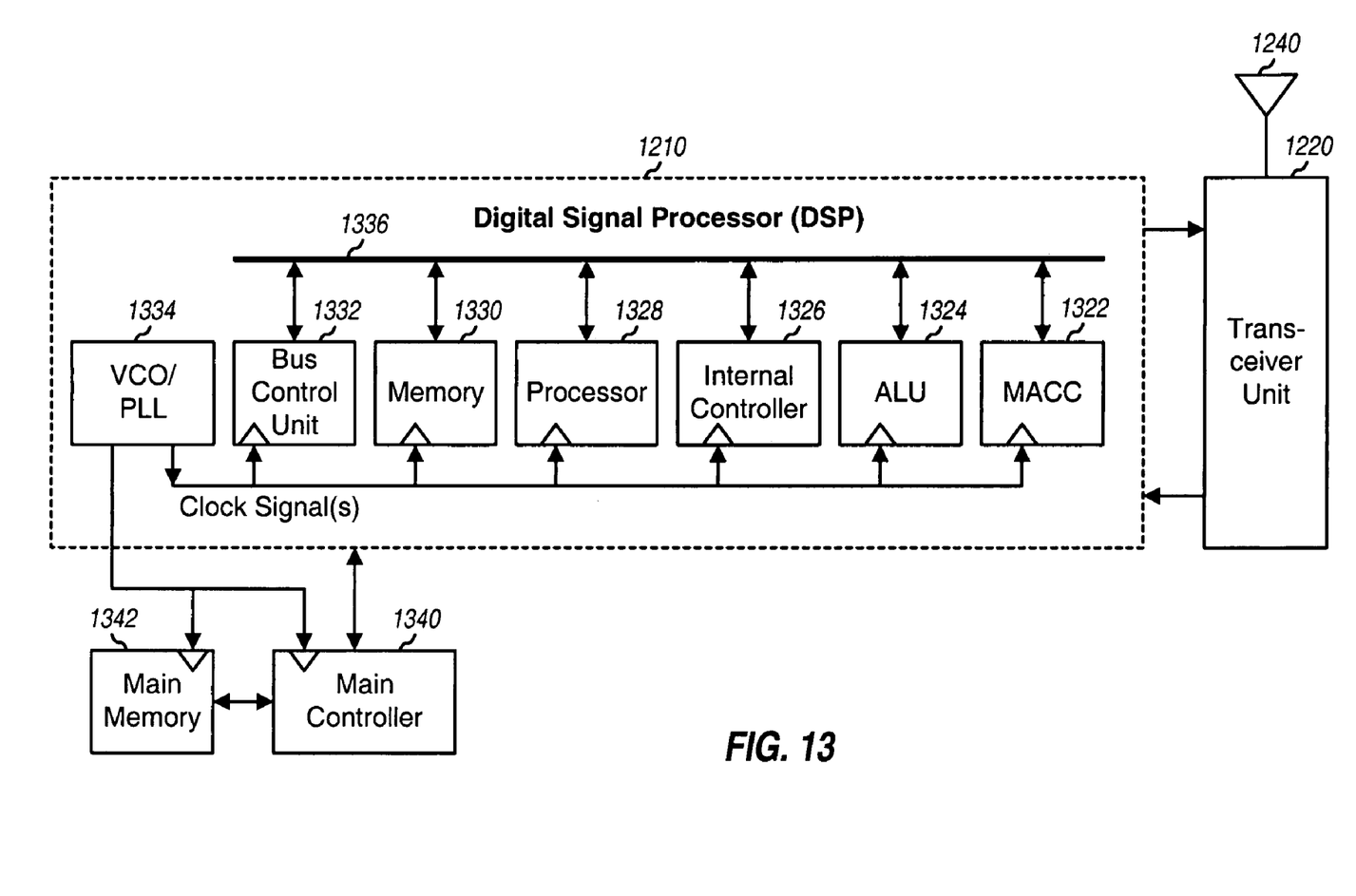
FIG. 13 shows a digital signal processor (DSP) within the wireless device.

FIG. 13 shows a block diagram of an embodiment of DSP 1210. DSP 1210 includes various processing units such as, for example, a multiply-accumulate (MACC) unit 1322, an arithmetic logic unit (ALU) 1324, an internal controller 1326, a processor 1328, a memory unit 1330, and a bus control unit 1332, all of which are coupled via a bus 1336. DSP 1210 further includes a VCO/PLL 1334 having a VCO that may be implemented with VCO 100a in FIG. 2. This VCO generates an oscillator signal that is used to generate clock signals for the processing units within DSP 1210 and possibly processing units external to DSP 1210 (e.g., a main controller 1340 and a main memory unit 1342). DSP 1210 may perform (1) encoding, interleaving, modulation, code channelization, spectral spreading, and so on, for the transmit path, and (2) despreading, code channelization, demodulating, deinterleaving, decoding, and so on, for the receive path. The processing by DSP 1210 is determined by the communication system.

Wireless device 1200 may be viewed as including a digital portion and an analog portion. The digital portion (e.g., DSP 1210 and possibly DACs 1222 and ADCs 1256) may be implemented on one or more digital integrated circuits. The analog portion (e.g., the remaining portion of transceiver unit 1220) may be implemented on one or more RF integrated circuits (RFICs) and/or with other discrete components.

The temperature compensated VCOs described herein may be used for various types of IC such as RFICs and digital ICs. These VCOs may also be used for DSPs, application specific integrated circuits (ASICs), processors, controllers, and so on. The temperature compensation techniques described herein may be used for various types of oscillators such as VCOs, current controlled oscillators (ICOs), voltage controlled crystal oscillators (VCXOs), and so on. The temperature compensation techniques described herein may also be used for other types of circuit such as tunable filters and so on.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An integrated circuit comprising:

a voltage controlled oscillator (VCO) operative to provide an oscillator signal having a frequency;

at least one reverse biased diode having a capacitance that is controlled by a reverse bias voltage to compensate for drift in the frequency of the oscillator signal due to temperature;

a current source operative to provide a bias current;

a current mirror operative to provide at least one version of the bias current; and a load resistor operative to receive the at least one version of the bias current and provide the reverse bias voltage wherein the at least one version of the bias current is selectable from among a plurality of possible versions of the bias current, and wherein different functions of reverse bias voltage versus temperature are obtained by selecting different combinations of bias current versions.

2. The integrated circuit of claim 1, wherein each of the at least one reverse biased diode is formed by a parasitic diode in the integrated circuit.

3. The integrated circuit of claim 2, wherein the parasitic diode is formed at a drain junction or a source junction of a metal-oxide semiconductor (MOS) transistor.

4. The integrated circuit of claim 1, wherein the VCO includes an amplifier operative to provide signal gain for the VCO, a resonator tank circuit operative to provide phase shift for the VCO, and at least one frequency tuning circuit operative to tune the frequency of the oscillator signal, each frequency tuning circuit including at least one tuning capacitor and at least one metal-oxide semiconductor (MOS) transistor operative to connect or disconnect the at least one tuning capacitor from the resonator tank circuit.

5. The integrated circuit of claim 4, wherein the VCO includes a plurality of frequency tuning circuits having progressively larger tuning capacitors.

6. The integrated circuit of claim 5, wherein for each of the plurality of frequency tuning circuits, the at least one MOS transistor for the frequency tuning circuit is sized proportional to capacitance of the at least one tuning capacitor for the frequency tuning circuit.

7. The integrated circuit of claim 4, wherein the at least one reverse biased diode is formed by parasitic diode at the at least one MOS transistor.

8. The integrated circuit of claim 1, wherein the current source operative to provide a bias current that is proportional to absolute temperature.

9. The integrated circuit of claim 1, further comprising;

a bias voltage generator operative to provide the reverse bias voltage for the at least one reverse biased diode, the bias voltage generator comprising wherein the resistor has a resistance that is proportional to absolute temperature.

10. An integrated circuit comprising:

a voltage controlled oscillator (VCO) operative to provide an oscillator signal having a frequency;

at least one reverse biased diode having a capacitance that is controlled by a reverse bias voltage to compensate for drift in the frequency of the oscillator signal due to temperature;

a look-up table operative to store a function of reverse bias voltage versus temperature, and a digital-to-analog converter operative to receive a temperature dependent value from the look-up table and provide the reverse bias voltage.

11. The integrated circuit of claim 1, wherein the oscillator signal is a local oscillator (LO) signal that is suitable for frequency upconversion or downconversion in a wireless communication system.

12. The integrated circuit of claim 11, wherein the wireless communication system is a Code Division Multiple Access (CDMA) system.

13. The integrated circuit of claim 11, wherein the wireless communication system is a Global System for Mobile Communications (GSM) system.

14. A wireless device comprising:
a voltage controlled oscillator (VCO) operative to provide an oscillator signal having a frequency;
at least one reverse biased diode having a capacitance that is controlled by a reverse bias voltage to compensate for drift in the frequency of the oscillator signal due to temperature;
a current source operative to provide a bias current;
a current mirror operative to provide at least one version of the bias current; and
a load resistor operative to receive the at least one version of the bias current and provide the reverse bias voltage
wherein the at least one version of the bias current is selectable from among a plurality of possible versions of the bias current, and wherein different functions of reverse bias voltage versus temperature are obtained by selecting different combinations of bias current versions.

15. The wireless device of claim 14, wherein each of the at least one reverse biased diode is formed by a parasitic diode at a drain junction or a source junction of a metal-oxide semiconductor (MOS) transistor.

16. An apparatus comprising:
a voltage controlled oscillator (VCO) operative to provide an oscillator signal having a frequency;
at least one reverse biased diode having a capacitance that is controlled by a reverse bias voltage to compensate for drift in the frequency of the oscillator signal due to temperature;
a current source operative to provide a bias current;
a current mirror operative to provide at least one version of the bias current; and
a load resistor operative to receive the at least one version of the bias current and provide the reverse bias voltage
wherein the at least one version of the bias current is selectable from among a plurality of possible versions of the bias current, and wherein different functions of reverse bias voltage versus temperature are obtained by selecting different combinations of bias current versions.

17. The apparatus of claim 16, wherein each of the at least one reverse biased diode is formed by a parasitic diode at a drain junction or a source junction of a metal-oxide semiconductor (MOS) transistor.

18. A method of performing temperature compensation for a voltage controlled oscillator (VCO), comprising:
estimating temperature of the VCO; wherein the temperature of the VCO is estimated with a circuit component having a characteristic that is proportional to absolute temperature
generating a reverse bias voltage for the estimated temperature, said generating comprising
generating a bias current,
selecting at least one version of the bias current from among a plurality of possible versions of the bias current based on a function of reverse bias versus temperature,
applying the selected at least one version of the bias current to a load resistor to provide the reverse bias voltage; and
applying the reverse bias voltage to at least one reverse biased diode to compensate for drift in frequency of oscillation for the VCO due to temperature.

19. The method of claim 18, wherein capacitance of the at least one reverse biased diode is adjusted by the reverse bias voltage to compensate for changes in capacitance of the VCO due to temperature.

* * * * *